(12) United States Patent
Marin Perez et al.

(10) Patent No.: US 10,886,727 B2
(45) Date of Patent: Jan. 5, 2021

(54) IRRIGATION CONTROLLER HAVING TRANSFORMER WITH RESETTABLE FUSE

(71) Applicant: Rain Bird Corporation, Azusa, CA (US)

(72) Inventors: Jose Martiniano Marin Perez, Tijuana (MX); Luis Antonio Mesina Muñoz, Tijuana (MX)

(73) Assignee: Rain Bird Corporation, Azusa, CA (US)

( * ) Notice: Subject to any disclaimer, the term of this patent is extended or adjusted under 35 U.S.C. 154(b) by 189 days.

(21) Appl. No.: 16/234,220

(22) Filed: Dec. 27, 2018

(65) Prior Publication Data

US 2020/0212667 A1    Jul. 2, 2020

(51) Int. Cl.

| | | |
|---|---|---|
| *H01F 27/40* | (2006.01) | |
| *H02H 7/04* | (2006.01) | |
| *H01F 27/02* | (2006.01) | |
| *H05K 1/18* | (2006.01) | |
| *A01G 25/16* | (2006.01) | |
| *H01F 27/32* | (2006.01) | |
| *G05B 19/042* | (2006.01) | |

(52) U.S. Cl.
CPC ............... *H02H 7/04* (2013.01); *A01G 25/16* (2013.01); *H01F 27/02* (2013.01); *H01F 27/327* (2013.01); *H01F 27/402* (2013.01); *H05K 1/181* (2013.01); *G05B 19/042* (2013.01); *H01F 27/32* (2013.01); *H01F 27/40* (2013.01); *H05K 2201/1003* (2013.01); *H05K 2201/10181* (2013.01)

(58) Field of Classification Search
USPC .......................................... 361/41
See application file for complete search history.

(56) References Cited

U.S. PATENT DOCUMENTS

| | | |
|---|---|---|
| 6,618,234 B1 | 9/2003 | Abdelghani |
| 7,298,598 B1 | 11/2007 | Morgan |
| 7,613,546 B2 | 11/2009 | Nelson |
| 7,643,257 B1 | 1/2010 | Morgan |
| 7,885,045 B1 | 2/2011 | Morgan |
| 7,916,458 B2 | 3/2011 | Nelson |
| 8,234,014 B1 | 7/2012 | Ingle |
| 8,443,546 B1 | 5/2013 | Darin |
| 8,515,561 B2 | 8/2013 | Tang |
| 8,867,194 B2 | 10/2014 | Woytowitz |

(Continued)

*Primary Examiner* — Danny Nguyen
(74) *Attorney, Agent, or Firm* — Fitch, Even, Tabin & Flannery LLP

(57) ABSTRACT

An irrigation controller comprising a housing, a control circuit having a processor and a memory, the control circuit configured to store and execute an irrigation schedule, an input connector configured to be coupled to an alternating current (AC) power supply and receive an AC power signal having a first voltage level, a transformer disposed at least partially in the housing, the transformer having a primary side and a secondary side, wherein the primary side is coupled to the input connector, a resettable fuse disposed at least partially in the housing, the fuse being electrically coupled in series between the input connector and the primary side of the transformer, driver circuitry disposed in the housing and electrically coupled to the secondary side of the transformer, and wherein the driver circuitry is coupled to the control circuit, and an output connector coupled to the driver circuitry.

18 Claims, 4 Drawing Sheets

(56) References Cited

U.S. PATENT DOCUMENTS

| | | |
|---|---|---|
| 9,155,254 B2 | 10/2015 | Edwards |
| 9,295,170 B1 | 3/2016 | Woytowitz |
| 9,786,422 B2 | 10/2017 | Edwards |
| 9,791,871 B1 | 10/2017 | Marschalkowski |
| 9,851,120 B2 | 12/2017 | Sapak |
| 10,021,842 B2 | 7/2018 | Martinez |
| 2011/0087379 A1* | 4/2011 | Savelle, Jr. .......... A01G 25/165 700/284 |
| 2018/0092261 A1 | 3/2018 | Sapak |
| 2018/0136675 A1 | 5/2018 | Marschalkowski |

* cited by examiner

IRRIGATION CONTROLLER HAVING TRANSFORMER WITH RESETTABLE FUSE

FIELD OF INVENTION

This invention relates to protection of an alternating current (AC) powered irrigation controller.

BACKGROUND OF THE INVENTION

Irrigation controllers are typically used to control and actuate valves controlling the flow of water therethrough. Irrigation controllers are often required to be connected to an external alternating current (AC) power source. Such irrigation controllers often use an input AC power signal at least to generate an output power signal used in actuating the valves. For example, a 110-120, 220-240 volts AC (VAC) (herein generally referred to as 120 and 240 VAC respectively) input AC voltage source (or other relevant input) is traditionally stepped down or converted into an output secondary voltage supply (e.g., 24 VAC, 25.5 VAC, and/or other relevant output voltage) using a conventional step-down transformer. The supply signal provides suitable power for actuating the various valves coupled to and controlled by the irrigation controller.

However, there are a number of issues in using the above described step-down power supply. The step-down transformer is constructed to step-down the voltage level of the input voltage (e.g., a primary voltage) to produce a voltage at the output of the transformer (e.g., a secondary voltage). Thus, a first problem with the step-down transformer power supply is that when the voltage level of the power source varies, the input voltage varies, and the step-down transformer produces the output voltage to follow the input voltage. Therefore, the output voltage level will vary in proportion to the input voltage level. When the level of the input voltage is too high, this can result in too much voltage at the transformer, and/or too high of an operating voltage at the irrigation controller or valve solenoids. This can result in damage to one or more of the transformer, the microcontroller of the irrigation controller, other electrical components (e.g., switches) of the irrigation controller, and any electrical components controlled by the irrigation controller (e.g., solenoids). Additionally, large spikes in the input voltage can result in damage to the transformer itself.

BRIEF SUMMARY OF THE INVENTION

Several embodiments answer the above and other needs by providing an irrigation controller with a fuse located within the controller on the primary winding side of the step-down transformer. In accordance with these embodiments, the irrigation controller includes a housing containing the transformer. A resettable fuse is mounted inside the housing on the primary side of the transformer. Driver circuitry for driving one or more valves of the irrigations system are also mounted within the housing, electrically coupled to the secondary side of the transformer. Some embodiments relate to the protection of an alternating current (AC) powered irrigation controller that controls the operation of an irrigation system. Further, some embodiments protect the irrigation controller from overvoltage conditions.

In one embodiment, an irrigation controller is provided comprising: a housing; a control circuit having a processor and a memory, the control circuit configured to store and execute an irrigation schedule; an input connector configured to be coupled to an alternating current (AC) power supply and receive an AC power signal having a first voltage level; a transformer disposed at least partially in the housing, the transformer having a primary side and a secondary side, wherein the primary side is coupled to the input connector; a resettable fuse disposed at least partially in the housing, the fuse being electrically coupled in series between the input connector and the primary side of the transformer; and driver circuitry disposed in the housing and electrically coupled to the secondary side of the transformer, and wherein the driver circuitry is coupled to the control circuit; and an output connector coupled to the driver circuitry; wherein, based on signaling from the control circuit, the driver circuitry is configured to selectively output a control signal to the output connector, the control signal based on the output of the secondary side of the transformer and the control signal configured to activate an electrically actuatable valve coupled to the output connector.

In another embodiment, a method is provided to control an irrigation system, the method comprising: providing an irrigation controller comprising: a housing; a control circuit having a processor and a memory, the control circuit configured to store and execute an irrigation schedule; an input connector configured to be coupled to an alternating current (AC) power supply and receive an AC power signal having a first voltage level; a transformer disposed at least partially in the housing, the transformer having a primary side and a secondary side, wherein the primary side is coupled to the input connector; a resettable fuse disposed at least partially in the housing, the fuse being electrically coupled in series between the input connector and the primary side of the transformer; and driver circuitry disposed in the housing and electrically coupled to the secondary side of the transformer, and wherein the driver circuitry is coupled to the control circuit; an output connector coupled to the driver circuitry; activating the fuse and cutting off power to the primary side of the transformer with the fuse in response to an input voltage exceeding a threshold value; and resetting the fuse to supply electrical power to the primary side of the transformer in response to the input voltage being equal to or less than the threshold value.

Some embodiments provide methods of protecting at least an irrigation controller, comprising: incorporating a transformer into an irrigation controller; electrically coupling a fuse with a primary side of the transformer between the transformer and an external power source, and electrically coupling a secondary side of the transformer with a control circuit of the irrigation controller and with one or more driver circuitry of the irrigation controller, wherein the transformer, in response to receiving an input voltage supplied to the primary windings from the external power source and through the fuse is below an input threshold, is configured to supply power to at least the control circuit and the one or more driver circuitry; reducing further current from flowing through the primary windings based on an activation of the fuse to a non-conductive state in response to the input voltage exceeding a predetermined threshold; maintaining the fuse in the non-conductive state while the input voltage is greater than predefined thresholds; and automatically resetting the fuse to a conductive state in response to the input voltage dropping below the threshold voltage without user interaction.

BRIEF DESCRIPTION OF THE DRAWINGS

The above and other aspects, features and advantages of several embodiments of the present invention will be more apparent from the following more particular description thereof, presented in conjunction with the following drawings.

Figure 1:
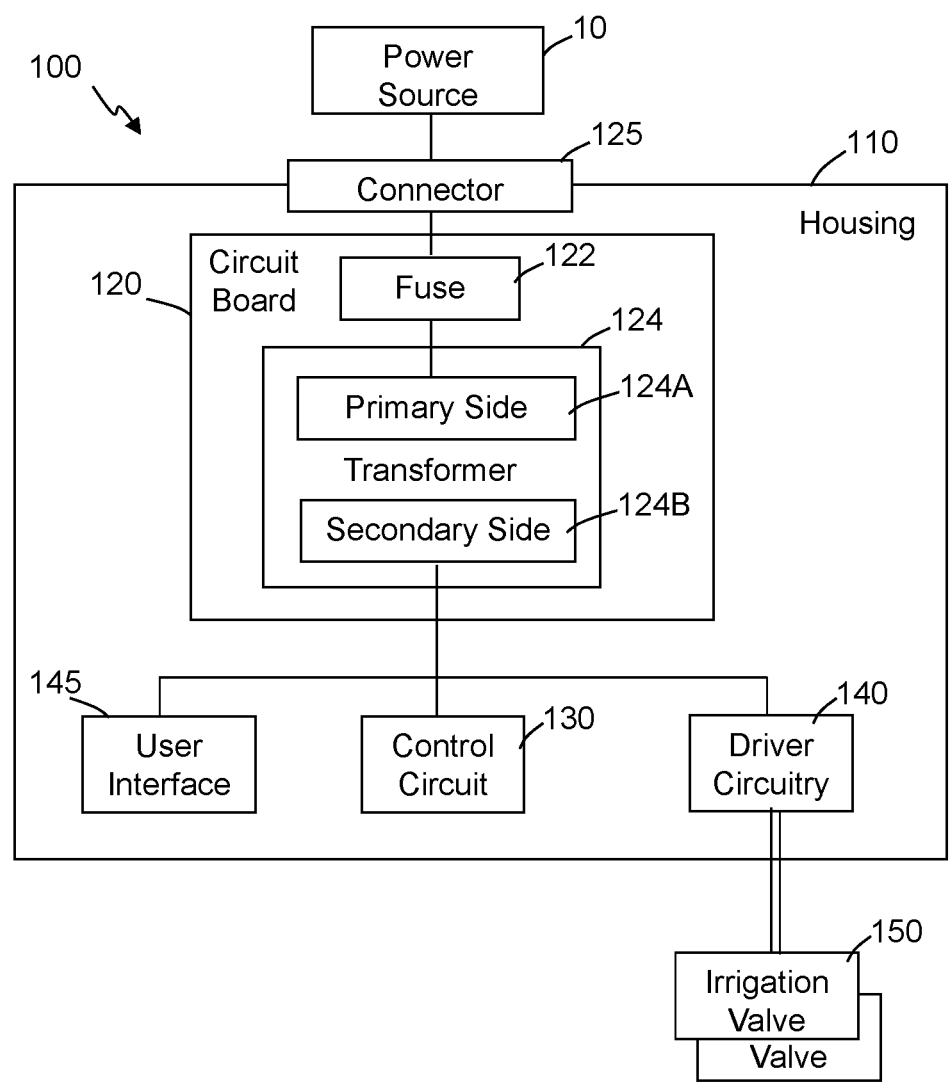
FIG. 1 is a simplified block diagram of an exemplary irrigation controller according to some embodiments.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

The following description is not to be taken in a limiting sense but is made merely for the purpose of describing the general principles of exemplary embodiments. The scope of the invention should be determined with reference to the claims.

Described herein are embodiments relating to providing overvoltage protection for irrigation controllers. Irrigation controllers are often powered by an AC power signal that is supplied at a much higher voltage level than the controller needs to control low voltage irrigation components coupled to the controller. Thus, the controller includes an AC power transformer positioned within a housing of the irrigation controller. The power transformer is configured to transform the incoming power supply signal into the lower voltage signal. To protect the transformer and electrical components on the secondary side of the transformer, in some embodiments, a resettable fuse is coupled in series between the AC power source and the primary side of the transformer. When the voltage level at the fuse is too high, e.g., due to misconnection to a voltage source that supplies a power signal that is too high or due to a spike or spurious condition in the input AC signal, the fuse opens or otherwise transitions to a non-functioning or non-conductive state to cutoff the electrical connection between the transformer and the external power source. Cutting off the electrical connection prevents power to the secondary side of the transformer and thus to the components of the irrigation controller. In some embodiments, the fuse is resettable so that the irrigation controller can be returned to a functioning state in response to the input voltage falling back to the threshold value without the need to replace any parts. In some forms, the resettable fuse is automatically resettable, such that it returns to an operating condition without any human input.

Figure 2A:
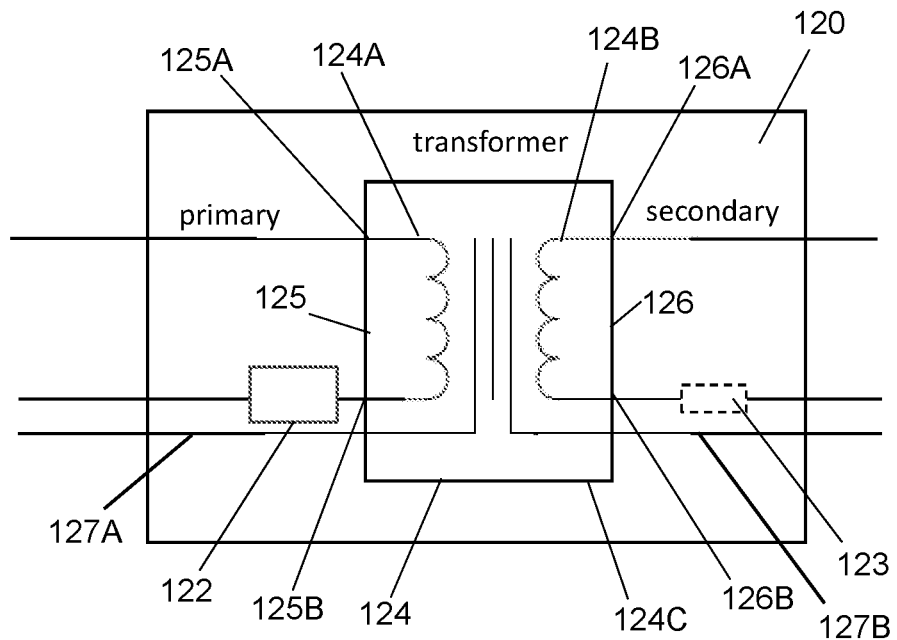
FIG. 2A-2C illustrate simplified block diagrams of exemplary printed circuit boards of the irrigation controller according to some embodiments.
Figure 2B:
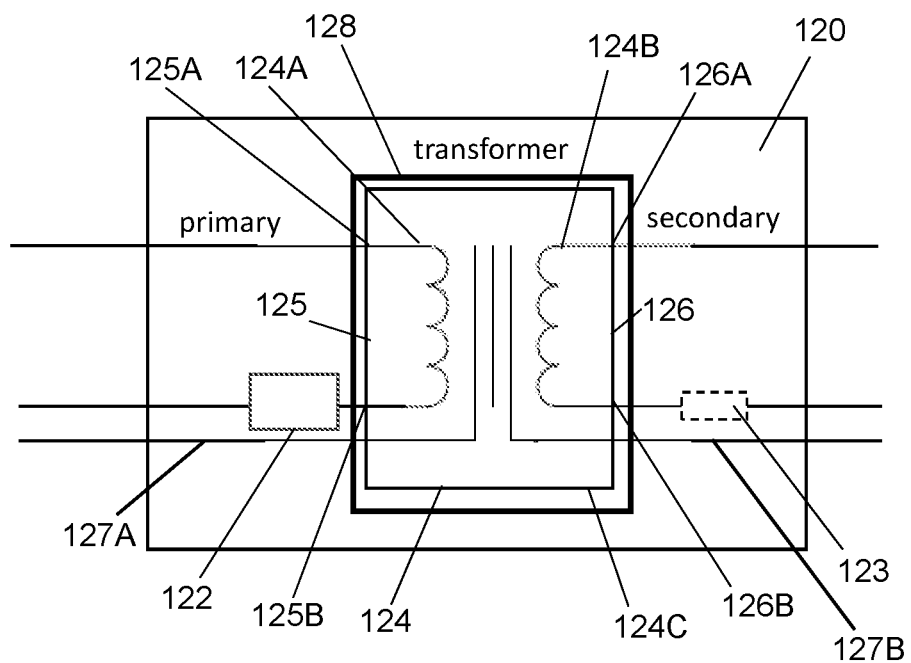
Figure 2C:
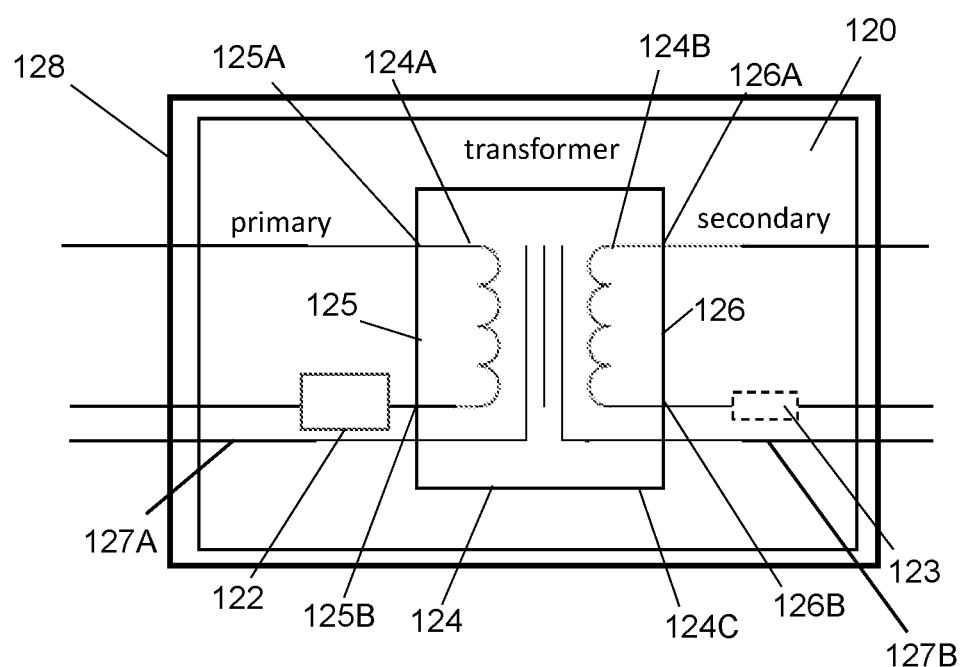

FIG. 1 illustrates a simplified block diagram of an exemplary irrigation controller 100, in accordance with some embodiments. FIGS. 2A-2C illustrate simplified block diagrams of exemplary circuit boards 120 configured to be incorporated into an irrigation controller 100, in accordance with some embodiments. Referring to FIGS. 1-2C, typically, the irrigation controller 100 includes a housing 110 that encloses or encases one or more components of the irrigation controller, and in some implementations protects the components of the irrigation controller from external weather conditions (e.g., rain, fog, sunlight, wind, etc.). Further, the housing may include a lock system to limit access to the interior of the irrigation controller housing 110. The irrigation controller 100 can include one or more transformers 124. In some embodiments, one or more printed circuit boards 120 are disposed within the housing 110, and one or more transformers 124 can be mounted to the printed circuit board 120. Further, the transformer 124 in many embodiments is a step-down AC transformer configured to receive a power signal at a first voltage and step the voltage down to at least one lower second voltage for use by one or more components of the irrigation controller. In some embodiments, the irrigation controller 100 further includes one or more power source input connectors 125 each configured to couple with one or more power lines from an external power source 10. The input connector is further electrically coupled with the transformer 124 to supply the received power signal to the transformer.

In one form, the transformer 124 is configured to electrically connect through the input connector 125 to the power source 10 to receive a power signal. The power signal, in some implementations, may supply an input voltage of 110-120 VAC, 220-240 VAC, or some other input voltage. In some implementations, as a further example, the first voltage level during normal operation may have a value comprising approximately one of 110, 120, 210, 220, 230 and 240 volts. In some embodiments, the transformer is configured to output through the secondary windings one or more output voltage levels comprising one or more of a value between approximately 20 and 30 volts. The transformer 124, in normal operations, is configured to receive the input power signal and step down this input voltage to a lower second output voltage consistent with the operating voltage of one or more components of the irrigation controller and/or to be forwarded from the irrigation controller to one or more external devices being controlled by the irrigation controller. For example, in some embodiments, the transformer is configured to step down a first input voltage to a second output voltage, for example a voltage of approximately 24 VAC, 25.5 VAC, or other relevant output voltage.

Still referring to FIGS. 1 and 2A-2C, the transformer 124 includes at least one primary winding or primary side 124A that is configured to electrically couple to an external power source 10, such as an electrical outlet, which provides the input voltage. In some embodiments, the input voltage is supplied through an input connector 125, such as an electrical cord, one or more input ports (e.g., such as an outlet that is typically see on a wall of a residence), one or more screw couplers, other such input connectors or a combination of two or more of such input connectors. Further, the transformer includes at least one secondary winding or secondary side 124B of the transformer 124 that is electrically coupled to one or more other components of the irrigation controller 100, such as but not limited to one or more control circuits 130, one or more driver circuitry 140, one or more user interfaces 145, one or more transceivers, other such components, and typically a combination of two or more of such components. The secondary side 124B provides the second output voltage that is stepped down to a lower voltage to power these other components. In some embodiments, the one or more power buses are coupled with the output side of the transformer and other components of the irrigation controller are coupled with one or more of the power buses.

Although not illustrated specifically, in some embodiments, the output of the secondary side 124B of the transformer can be coupled to a rectifier or other AC to DC converter to convert the stepped down AC output of the transformer to a DC voltage (e.g., 5 volts DC or other low voltage DC signal) that is coupled to at least the control circuit 130 and the user interface 145. This DC voltage provides operational power to the user interface 145 and the control circuit 130. Further, the stepped down AC output of the transformer 124 is directly coupled to the driver circuitry 140, which can selectively switch the stepped down AC signal to one or more valve or station output lines each connected to one or more respective irrigation valves 150. Control of the driver circuitry 140 is provided by the control circuit 130 which provides control signals to the driver circuitry 140.

One or more fuses 122 are electrically coupled to the transformer 124 between the transformer 124 and the external power source 10. In some embodiments, the fuse 122 is mounted to the same printed circuit board 120 as the transformer 124 and is at least partially within the housing 110, and typically fully within the housing 110. In some embodiments multiple fuses are used as added protection (e.g., a set of two or more fuses are coupled in series as backups, and/or a set of two or more fuses may be coupled in parallel providing alternative paths for electrical power in the event of one or more of the fuses failing or incorrectly opening. The fuse 122, in at least some implementations, is configured to switch, blow, open or otherwise transition from a conducting state to a non-conducting state when the input voltage exceeds a threshold value. This threshold value is typically dependent on an expected input voltage, and in some instances may additionally or alternatively be dependent on the second output voltage to be supplied to the components of the irrigation controller 100. Typically, the opening or other such transition of the fuse 122 breaks the electrical connection or otherwise prevents or limits electrical conductivity from the external power supply 10 to the transformer 124. In some forms, the fuse 122 is a single use fuse that must be replaced after opening once. In other embodiments, however, the fuse 122 is resettable such that it can be returned to a closed or conductive state in response to removal of the high voltage condition and/or high current condition. Typically, the fuse is reset when the input voltage falls back down to acceptable levels (i.e., equal to or less than the threshold value or a separate threshold value, which is typically less than the trip or open threshold value), or the connector is coupled to a voltage source supplying an input voltage that is within or less than the input threshold of the fuse 122. A resettable fuse 122 may be manually resettable (e.g., a user has to initiate the resetting), such as a circuit breaker, or automatically resetting, such as a polymeric positive temperature coefficient (PPTC) fuse or POLYFUSE, MULTIFUSE or POLYSWITCH, which are commercially available from multiple different suppliers and rated at the voltage threshold intended for the respective irrigation controller. For example, in some embodiments, the resettable fuse is configured with a rated current threshold, voltage threshold and/or power threshold and configured to open in the event a larger than rated power source supplying a power signal greater than the rated current threshold, voltage threshold and/or power threshold is connected to the input connector. By way of example, PPTC fuses can be purchased from RFE International of Costa Mesa, Calif., e.g., Radial Leaded PPTC FRV Series PPTCs having a rated voltage of 240 $V_{MAX}$, VAC/DC and Max Int Voltage of 265 $V_{MAX}$, $V_{AC}$, with variations in rated hold current, trip current, max time to trip, maximum current, typical power and resistance ($R_{MIN}$ and $R1_{MAX}$) depending on the model selection, manufactured by Fuzetec Technology Co., LTD. By way of other examples, line-voltage-rated (LVR) PPTC fuses can be purchased from Littlefuse, Inc. of Chicago, Ill., and can be selected between various models to provide the desired protection, FN250-600, from Wuhan FoFunction Electronics Co., Ltd. (FoFunction) of Wuhan City, China. Several other alternate equivalents exist in the market but are not listed here.

While the fuse 122 of some embodiments is intended to protect against overvoltage conditions, resettable fuses such as PPTC fuses by their nature also protect against overcurrent conditions providing additional protection for the transformer and controller. Thus, in some embodiments, the fuse selection allows for protection against overvoltage and overcurrent conditions.

In at least some embodiments, an automatically resettable fuse 122 can be formed of materials that increase in electrical resistance as their temperature rises. For example, the fuse 122 is configured to be electrically conductive at or below the threshold input voltage and/or threshold input current. When the threshold input voltage and/or threshold input current is exceeded, the fuse 122 heats up until the high level or a resistance increases in response to the increased temperature preventing most or all of the power from reaching the primary side 124A of the transformer 124. When the input voltage and/or current decreases to or below the respective thresholds, the fuse 122 cools down to a more conductive point.

As shown in FIGS. 1 and 2A-2C, the transformer 124 is coupled with components within the irrigation controller and supplies the stepped down power to the components. For example, the stepped down output power is supplied to one or more driver circuitry 140, the control circuit 130, and/or other components, and in some cases, the signal to one or more components is further converted to a DC signal by a rectifier or other AC to DC converter. Although only one driver circuitry 140 is shown, it is understood that driver circuitry 140 may include a plurality of drivers each configured to operate one or more external components, such as irrigation valves 150 of different irrigation zones, pumps, lights, fountains, and/or other such irrigation components controlled by the irrigation controller, or a combination of two or more of such components. In some embodiments, the driver circuitry comprises switches, triacs, relays, and the like, that are controllable using control outputs from the control circuit 130.

In some forms, the irrigation controller 100 is a modular irrigation controller configured with slots that are configured to receive one or more modules that can be inserted into the housing to provide functionality to the irrigation controller. For example, some modules include the driver circuitry 140. One or more modules may additionally or alternatively provide other functionality, such as but not limited to wireless communication, wireless valve activation, reflash capabilities, other such functionality, or a combination of two or more different functionality. The secondary side 124B of the transformer 124 can be electrically coupled to expansion slots, to which a variety of irrigation feature modules can be coupled. Exemplary modular irrigation controllers are described in U.S. patent application Ser. No. 15/952,060, filed Apr. 12, 2018 with the title "Modular and Expandable Irrigation Controller", which is hereby incorporated by reference in its entirety.

The driver circuitry 140 is controlled by a microcontroller or control circuit 130. The control circuit 130 includes memory configured to store an irrigation schedule and a processor configured to execute the stored schedule. The control circuit 130 is programmable such that the stored schedule can be modified. In some forms, the irrigation controller includes a local user interface 145 and/or other such inputs/outputs, such as one or more screens, displays, lights, LEDs, buttons, dials, a touch screens, other such inputs/outputs or combination of two or more of such inputs/outputs, allowing a user to access information about the irrigation controller and/or operation of the irrigation controller, to enter an irrigation schedule, to modify one or more stored irrigation schedules at the irrigation controller 100, specify thresholds, define override threshold or parameters (e.g., rain threshold, temperature threshold, other such thresholds), and to enter other such information and/or to obtain other such information.

In some embodiments, the irrigation controller includes one or more display screens coupled with the control circuit 130 and/or a separate display microcontroller to drive the one or more display screens to display information. The control circuit and/or display microcontroller can be configured to display a user interface screen that allows a user to select one of a plurality of functions, options, and the like to acquire information, input information, define and/or modify irrigation schedules, define or adjust thresholds and/or other such operating parameters, and the like. For example the control circuit can generate and display a sequence of display screens to facilitate the programming of the irrigation controller. In accordance with some embodiments, the control circuit can cause the display to display text that provides the information and/or one or more soft key or options that can be selected through a touch screen or the selection of one or more physical buttons that are positioned to correspond to the displayed soft keys (e.g., positioned directly below the display with the display presenting the soft keys in alignment with the physical buttons.

Alternatively or additionally, the irrigation controller 100 includes communication circuitry (not shown) for communicating with a remote computing device (e.g., computer, laptop, smartphone, central irrigation controller, server, etc.), such as over the internet, a local wired and/or wireless network, direct wireless communication, and/or other such communication with the remote computing device, for receiving an irrigation schedule, receiving a modified schedule or data based on which the control circuit 130 will modify the schedule, status information, software updates, and the like. Similarly, in some embodiments, the control circuit 130 can cause communications from the irrigation controller to one or more remote computing devices over one or more wired and/or wireless communication networks.

Further, it is noted that in some embodiments, the user interface 145 is not included in the controller 100 but is included in an external device in communication with the controller, e.g., using a wired or wireless transceiver (not shown) coupled to the control circuit. For example, the user interface could be implemented at a remote device such as a mobile telephone or tablet running an app providing the user interface. In other embodiments, the user interface 145 is included and can work in conjunction with a remote device (such as a mobile phone or tablet) providing one or more user interface functions.

In some forms, the control circuit 130 is electrically coupled to the secondary side 124B of the transformer 124.

Alternatively, the control circuit 130 is separately powered by a DC power supply coupled with the secondary side 124 of the transformer 124, e.g., by a battery or other DC source, or as converted from an output of the transformer.

The irrigation controller 100 may include additional features not shown in FIGS. 1-2C. For example, the control circuit 130 may be communicatively coupled to sensor circuits. The sensor circuits provide data, such as weather data, soil moisture data, etc., which may be used by the control circuit 130 to modify the stored schedule, provide information to a user, provide information to a remote central controller, or the like.

Referring to FIG. 2A-2C, in some embodiments the transformer 124 includes the input connector 125, which in some applications includes two leads 125A, 125B connected to the two ends of the primary winding 124A. The input connector is configured to connect to the external power source 10 to receive an AC power signal therefrom at an input first voltage level and input first current level. Further, in some embodiments, the fuse 122 is coupled in series with the primary winding 124A and external power source 10, such that opening the fuse 122 breaks the circuit of the primary winding 124A and power source 10 or otherwise effectively reduces conductivity to a negligible level. It is also noted that in FIGS. 2A-2C, ground leads 127A and 127B are illustrated on the primary side 124A and the secondary side 124B respectively. In some embodiments, the ground lead 127A is included and the ground lead 127B may not be required depending on the installation application.

The transformer 124 further includes at least one output connector 126 having at least two leads 126A, 126B that are coupled to respective ends of the secondary winding 124B for providing an AC power signal at a second, lower output voltage level to one or more components of the irrigation controller 100 (e.g., the driver circuitry 140, the control circuit 130, modules, sensors, user interface, display screen, switches, other such components, or a combination of two or more of such components. In some forms, one or more secondary fuses 123 can additionally or alternatively be included and can be wired in series with the secondary windings 124B to protect the transformer 124 from voltage spikes originating on the secondary side, such as from lightning strikes conducted by the irrigation system back to the irrigation controller 100. The transformer 124 can further include a transformer housing 124C and/or include some protection from environmental conditions. Further, the fuse 122 (and/or the secondary fuse 123) is typically mounted outside of the transformer housing 124C.

Additionally or alternatively, in some embodiments, the some or all of the transformer 124 and/or circuit board 120 may be encapsulated, enveloped, encased or the like within one or more layers of an encapsulation material 128 (e.g., plastic, silicon, rubber, resin, other such material or combination of such material) to protect part of or all of the transformer and/or circuit board from environmental conditions, moisture and the like, and/or to prevent user exposure to high voltage and/or high current at or within the transformer. In some embodiments, an encapsulation material is selected to have dielectric properties to maintain electrical isolation performance outlined in the 2018 UL standards (e.g., UL1951 & S5085) published by UL LLC. Some embodiments further include one or more junction boxes, which may provide the input connectors 125, and enables the coupling of the transformer to the power source (e.g., allowing a customer to make the electrical connection at the installation site). Other embodiments may provide a power cord as at least part of the connector 125 (e.g., simplified connection versions of the irrigation controller, indoor versions of the irrigation controller, etc.) where the power cord is already connected to the transformer (i.e., the customer simply plugs it into the residential outlet). Power cord can be configured and/or rated for internal and external installations enabling the irrigation controller to be used indoors or outdoors. FIG. 2B illustrates an exemplary circuit board 120 configured to be incorporated into an irrigation controller 100, in accordance with some embodiments, and including a transformer 124 that has been fully encapsulated within an encapsulation material 128. In other implementations less than the entire transformer is encapsulated, such as one or more of the primary windings 124A, one or more of the secondary windings 124B, other parts of the transformer, or a combination of two or more of the parts of the transformer. For example, the transformer or windings of the transformer may be encapsulated within a resin to protect users and/or preventing moisture from contacting the windings. In some implementations, such as shown in FIG. 2B, the fuse 122 is not encased within the encapsulation material that is encasing some or all of the transformer. In some embodiments, however, some or all of the fuse may be encased in its own encapsulation material.

FIG. 2C illustrates an exemplary circuit board 120 configured to be incorporated into an irrigation controller 100, in accordance with some embodiments, and the circuit board and the components coupled with the circuit board are encapsulated within an encapsulation material 128. In other embodiments part of the circuit board may be encapsulated while one or more parts of the circuit board are not encapsulated. Similarly, one or more components coupled with the circuit board may be encapsulated while other components are not encapsulated.

Depending on the embodiment and the components that are encapsulated, the manufacturing process can be varied to enhance manufacturing efficiency. For example, in embodiments such as shown in FIG. 2B where the transformer only is encapsulated with the board connectors exposed, the manufacturing process involves obtaining encapsulated transformers, mounting them to a printed circuit board 120, and mounting the other components including the fuse 122. In embodiments such as shown in FIG. 2C, the transformer (pre-encapsulation) is mounted to the circuit board 120 along with the other components such as the fuse 122, then the entire assembly is encapsulated.

In operation, the fuse 122 allows or prevents the flow of electricity through the transformer 124 from the external power source 10. In response to the voltage and/or current exceeding a corresponding threshold, the fuse is activated to open or otherwise transition to a non-conductive or substantially non-conductive state effectively preventing further current through the primary windings providing protection to the primary windings, and thus preventing further step-down transforming of the second, output signal, which provides protection to the components of the irrigation controller 100. Similarly, the secondary fuse 123 can be triggered in response to the voltage and/or current at the secondary windings exceeding a secondary side threshold to provide protection to the secondary windings 124B and the primary windings 124A (e.g., in response to a spike from a lightning flash, a short circuit, or other such pulse). In some embodiments, the resettable fuse is configured to open to disconnect the AC power signal from the primary side of the transformer when one or more of the following events occur: the transformer is connected to a larger than rated power source, the power source provides a surge in power, and the power source provides a spurious AC power signal. Similarly, the resettable fuse can be configured to returns to a normal operating condition and reconnects the AC power signal to the primary side of the transformer when the condition of event is removed (e.g., transformer is connected to a power source at the rated power, surge power is eliminated or drops back below a threshold, spurious AC power signals are no longer received at the primary windings, etc.).

Figure 3:
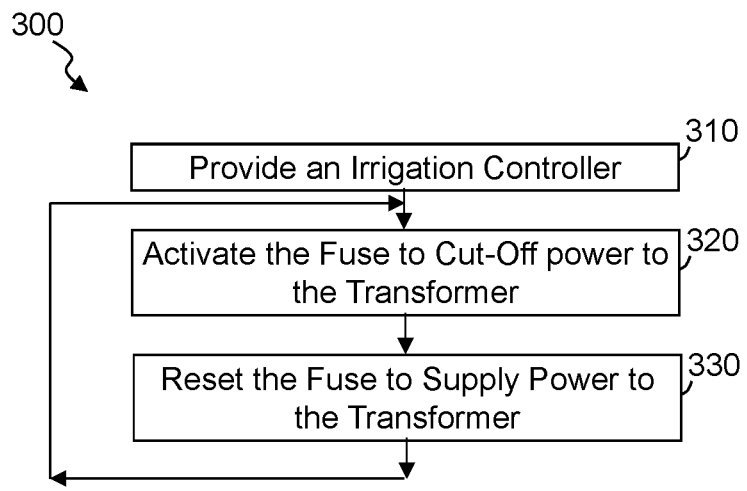
FIG. 3 illustrates a simplified flow diagram of an exemplary process of controlling an irrigation system according to some embodiments.

FIG. 3 illustrates a simplified flow diagram of an exemplary process 300 of controlling an irrigation system, in accordance with some embodiments. In step 310, an irrigation controller is provided that includes a transformer with at least one fuse coupled to each of the one or more primary windings of the transformer. In step 320, the fuse is activated cutting off power or limiting current to the primary side of the transformer in response to an input voltage exceeding a voltage threshold value and/or an input current exceeding a current threshold, such as through misconnection to a source that is too high or to a spurious high voltage condition in an otherwise correct AC voltage source. In step 330, the fuse is reset to supply electrical power to the primary side of the transformer in response to the input voltage and current being equal to or less than the corresponding threshold values.

The transformer 124 is incorporated into an irrigation controller, such as the irrigation controller 100 and transformer 124 described above with reference to FIGS. 1 and 2A-2C. The fuse 122 is coupled with the primary side 124A of the transformer 124 and the transformer is electrically connected to an input voltage and current from a power source 10 through the fuse 122. In some implementations, the fuse 122 reacts to and/or to the condition when the input voltage exceeds a predetermined threshold and/or an input current exceeds a predetermined current threshold. The fuse 122 is activated in response to one or both of the current and voltage thresholds are exceeded and disconnects the transformer 124 from the input voltage or reduces or prevents further current from flowing through the primary windings 124A of the transformer 124. As described above, a PPTC fuse may not completely disconnect the transformer 124 from the input voltage, but substantially disconnects the transformer 124 by becoming highly resistant resulting in a significantly reduced current that is insufficient to generate a voltage at the secondary windings 124B or that the output voltage at the secondary windings is sufficiently low enough to prevent damage to internal components of the irrigation controller.

The fuse is maintained in the non-conductive state while the input voltage and/or current is greater than respective predefined thresholds. Alternatively, when the input voltage and current drop below the respective thresholds the fuse is automatically reset without user interaction. The process can activate the fuse in the event the input voltage and/or current exceed the respective thresholds. In some embodiments, the fuse is automatically returned to the conductive state based on the temperature of the fuse after a period of time drops to a predefined temperature in response to the voltage and/or current have dropped to corresponding threshold levels.

Some embodiments provide a process of protecting and/or controlling an irrigation system by in part incorporating a transformer into the irrigation controller, such as the irrigation controller 100 and transformer 124 described above. The primary side of the transformer 124 can be connected through one or more fuses 122 with an input voltage. The fuse 122 is activated when the input voltage and/or current exceeds a predetermined threshold to transition to a low conductive state or non-conductive state. For example, when the threshold voltage is exceeded, the fuse 122 disconnects the transformer 124 from the input voltage. As described above, some embodiments utilize a PPTC fuse as the fuse 122, which may not completely disconnect the transformer 124 from the input voltage and/or may not completely prevent all current. However, such PPTC fuses are configured to substantially disconnect the transformer 124 from the input source and/or significantly reduce the current through the transformer by becoming highly resistant such that the secondary winding does not generate an output voltage or generates an output voltage that is insufficient to be used by most if not all of the components of the irrigation controller.

If the input voltage and/or current does not exceed the threshold value, the fuse 122 continues to allow current flow at sufficient levels and/or returns to a conductive state, effectively connecting the primary side 124A of the transformer 124 to the input voltage. After either connecting or disconnecting the transformer 124 to the input voltage, the fuse 122 continues to react to the input voltage and/or current and to transition to the non-conductive state when the corresponding threshold value is exceeded.

In some forms, the fuse 122 is configured to open the connection between the transformer 124 and external power source 10 in response to any one of a plurality of events. Exemplary events include but are not limited to connecting the transformer 124 to a higher than rated power source (e.g., if a 120 VAC rated transformer 124 is connected to a 240 VAC power source), a sudden surge in voltage from a properly rated power source 10 (such as the result of a lightning strike), in the event of a spurious power signal from the external power source 10 (e.g., a spurious power signal may include an inconsistent power signal or a power signal at a frequency other than that for which the irrigation controller 100 is rated), and/or other such events.

Figure 4:
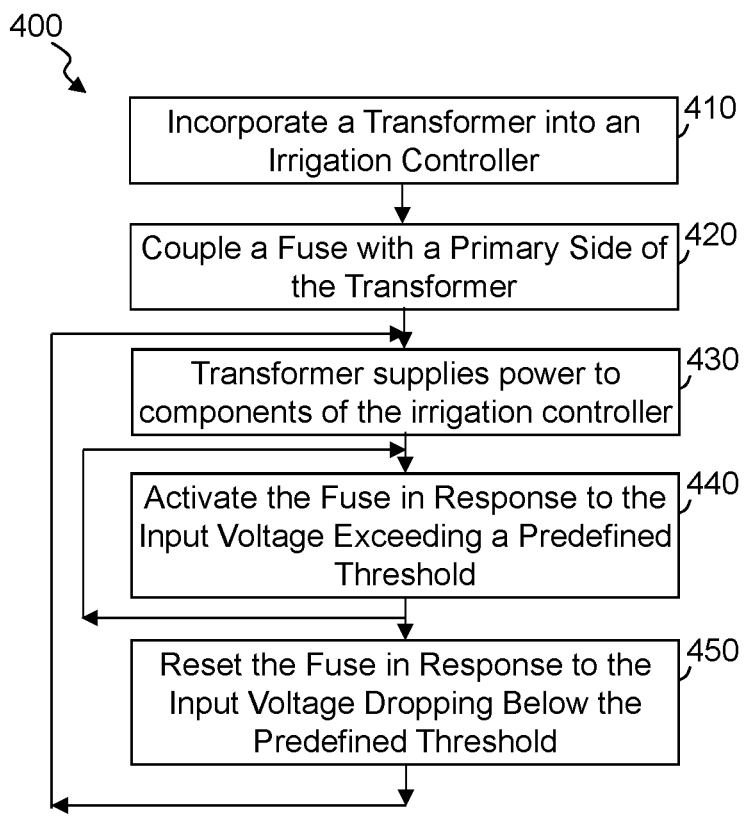
FIG. 4 illustrates a simplified flow diagram of an exemplary process of protecting an irrigation system in accordance with some embodiments.

FIG. 4 illustrates a simplified flow diagram of an exemplary process 400 of protecting an irrigation system in accordance with some embodiments. In step 410, a transformer 124 is incorporated into an irrigation controller, such as the irrigation controller 100 and transformer 124 described above with reference to FIGS. 1 and 2A-2C. In step 420, a fuse 122 is coupled with the primary side 124A of the transformer 124 between the transformer and a power source. In step 430, the transformer operates to supply power to at least internal components of the irrigation controller while the voltage and current supplied to the primary windings of the transformer are below an input threshold. In step 440, the fuse 122 is activated in response to the input voltage and/or input current exceeding a respective predetermined threshold reducing or preventing further current from flowing through the primary windings 124A of the transformer 124.

The process 400 is maintained in this state with the fuse in the non-conductive state while the input voltage and/or current is greater than predefined thresholds. Alternatively, the process 400 advances to step 450 where the fuse is automatically reset when the input voltage and/or current drops below the threshold without user interaction. The process 400 returns to step 430 with the transformer receiving the input voltage through the fuse and continuing to operate to step down the input voltage to provide the output voltage to one or more components of the irrigation controller while the input voltage and/or current is below the threshold. The fuse continues to be available to be activated in the event the input voltage and/or input current exceed the respective threshold. In some embodiments, the fuse is automatically returned to the conductive state based on the temperature of the fuse drops to a predefined temperature in response to the input voltage and current having dropped to below the input thresholds.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

While the invention herein disclosed has been described by means of specific embodiments, examples and applications thereof, numerous modifications and variations could be made thereto by those skilled in the art without departing from the scope of the invention set forth in the claims.

What is claimed is:

1. An irrigation controller comprising:
a housing;
a control circuit having a processor and a memory, the control circuit configured to store and execute an irrigation schedule;
an input connector configured to be coupled to an alternating current (AC) power supply and receive an AC power signal having a first voltage level;
a transformer disposed at least partially in the housing, the transformer having a primary side and a secondary side, wherein the primary side is coupled to the input connector;
a resettable fuse disposed at least partially in the housing, the fuse being electrically coupled in series between the input connector and the primary side of the transformer; and
driver circuitry disposed in the housing and electrically coupled to the secondary side of the transformer, and wherein the driver circuitry is coupled to the control circuit; and
an output connector coupled to the driver circuitry;
wherein, based on signaling from the control circuit, the driver circuitry is configured to selectively output a control signal to the output connector, the control signal based on the output of the secondary side of the transformer and the control signal configured to activate an electrically actuatable valve coupled to the output connector.

2. The irrigation controller of claim 1 wherein the resettable fuse is configured with a rated voltage threshold and to open in the event a larger than rated voltage source supplying a power signal with a voltage greater than the rated voltage threshold is connected to the input connector.

3. The irrigation controller of claim 1 wherein the resettable fuse is configured to open in the event a spurious AC power signal is received at the input connector.

4. The irrigation controller of claim 1,
wherein the resettable fuse is configured to open to disconnect the AC power signal from the primary side of the transformer when one or more of the following events occur: the transformer is connected to a larger than rated voltage source, the power source provides a surge in voltage, and the power source provides a spurious AC power signal; and
wherein when the condition of event is removed, the resettable fuse returns to a normal operating condition and reconnects the AC power signal to the primary side of the transformer.

5. The irrigation controller of claim 1 wherein the fuse is a polymeric positive temperature coefficient fuse.

6. The irrigation controller of claim 1 wherein the transformer comprises a transformer housing, and wherein the fuse is positioned outside of the transformer housing.

7. The irrigation controller of claim 6 wherein the primary side and secondary side of the transformer are disposed within the transformer housing.

8. The irrigation controller of claim 1 wherein the first voltage level during normal operation have a value comprising approximately 110, 120, 210, 220, 230 and 240 volts.

9. The irrigation controller of claim 1 wherein the second voltage level has a value between approximately 20 and 30 volts.

10. The irrigation controller of claim 1 wherein the transformer is mounted to a printed circuit board disposed in the housing.

11. The irrigation controller of claim 10 wherein the fuse is coupled to the printed circuit board.

12. The irrigation controller of claim 11, wherein at least a primary winding of the primary side of the transformer and a secondary winding of the secondary side of the transformer are each encased within an encapsulation material.

13. The irrigation controller of claim 12, wherein the fuse is not encased within the encapsulation material that is encasing the primary winding and the secondary winding.

14. A method of controlling an irrigation system, the method comprising:
   providing an irrigation controller comprising:
      a housing;
      a control circuit having a processor and a memory, the control circuit configured to store and execute an irrigation schedule;
      an input connector configured to be coupled to an alternating current (AC) power supply and receive an AC power signal having a first voltage level;
      a transformer disposed at least partially in the housing, the transformer having a primary side and a secondary side, wherein the primary side is coupled to the input connector;
      a resettable fuse disposed at least partially in the housing, the fuse being electrically coupled in series between the input connector and the primary side of the transformer;
      driver circuitry disposed in the housing and electrically coupled to the secondary side of the transformer, and wherein the driver circuitry is coupled to the control circuit; and
      an output connector coupled to the driver circuitry;
   activating the fuse and cutting off voltage to the primary side of the transformer with the fuse in response to an input voltage exceeding a threshold value; and
   resetting the fuse to supply electrical power to the primary side of the transformer in response to the input voltage being equal to or less than the threshold value.

15. The method of claim 14 wherein the resetting the fuse comprises automatically resetting the fuse.

16. The method of claim 14, wherein the cutting off voltage comprises increasing the electrical resistance of the fuse.

17. The method of claim 16 wherein the resetting the fuse comprises reducing the electrical resistance of the fuse.

18. A method of protecting at least an irrigation controller, the method comprising:
   incorporating a transformer into an irrigation controller;
   electrically coupling a fuse with a primary side of the transformer between the transformer and an external power source, and electrically coupling a secondary side of the transformer with a control circuit of the irrigation controller and with one or more driver circuitry of the irrigation controller, wherein the transformer, in response to receiving an input voltage supplied to the primary windings from the external power source and through the fuse is below an input threshold, is configured to supply power to at least the control circuit and the one or more driver circuitry;
   reducing further current from flowing through the primary windings based on an activation of the fuse to a non-conductive state in response to the input voltage exceeding a predetermined threshold;
   maintaining the fuse in the non-conductive state while the input voltage is greater than predefined thresholds; and
   automatically resetting the fuse to a conductive state in response to the input voltage dropping below the threshold voltage without user interaction.

* * * * *